(12) United States Patent
Taniguchi et al.

(10) Patent No.: US 7,944,432 B2
(45) Date of Patent: May 17, 2011

(54) DATA INPUT DEVICE, DATA INPUT METHOD, DATA INPUT PROGRAM AND RECORDING MEDIUM WHEREIN SUCH DATA INPUT PROGRAM IS RECORDED

(75) Inventors: Nobumitsu Taniguchi, Arakawa-ku (JP); Masanori Mizushima, Arakawa-ku (JP)

(73) Assignee: Appside Co., Ltd., Tokyo (JP)

( * ) Notice: Subject to any disclaimer, the term of this patent is extended or adjusted under 35 U.S.C. 154(b) by 801 days.

(21) Appl. No.: 11/793,911

(22) PCT Filed: Dec. 22, 2005

(86) PCT No.: PCT/JP2005/023587
§ 371 (c)(1),
(2), (4) Date: Jun. 21, 2007

(87) PCT Pub. No.: WO2006/068218
PCT Pub. Date: Jun. 29, 2006

(65) Prior Publication Data
US 2008/0094355 A1    Apr. 24, 2008

(30) Foreign Application Priority Data
Dec. 22, 2004    (JP) ................................ 2004-371390

(51) Int. Cl.
*G09G 5/00* (2006.01)
(52) U.S. Cl. ...... 345/156; 345/173; 345/184; 178/18.01
(58) Field of Classification Search ............... 178/18.01, 178/18.05, 18.06; 341/34, 35; 379/353; 345/156, 173, 174, 176, 184
See application file for complete search history.

(56) References Cited

U.S. PATENT DOCUMENTS

| | | | | |
|---|---|---|---|---|
| 5,557,299 | A * | 9/1996 | Maynard et al. | 345/168 |
| 7,046,230 | B2 * | 5/2006 | Zadesky et al. | 345/156 |
| 7,466,307 | B2 * | 12/2008 | Trent et al. | 345/173 |
| 2003/0030452 | A1 | 2/2003 | Okada et al. | |
| 2004/0052016 | A1 * | 3/2004 | Takagi et al. | 361/51 |
| 2004/0070567 | A1 * | 4/2004 | Longe et al. | 345/156 |
| 2005/0248526 | A1 * | 11/2005 | Twerdahl et al. | 345/156 |
| 2006/0028454 | A1 * | 2/2006 | Branton et al. | 345/173 |

FOREIGN PATENT DOCUMENTS

| | | |
|---|---|---|
| JP | 60200333 A | 10/1985 |
| JP | 11-331345 | 11/1999 |
| JP | 11-331345 A | 11/1999 |
| JP | 2003-131786 | 5/2003 |
| JP | 2003-131786 A | 5/2003 |
| JP | 200486437 A | 3/2004 |
| JP | 2004-246599 | 9/2004 |
| JP | 2004-246599 A | 9/2004 |

* cited by examiner

*Primary Examiner* — Amare Mengistu
*Assistant Examiner* — Koosha Sharifi
(74) *Attorney, Agent, or Firm* — Porzio, Bromberg & Newman, P.C.

(57) ABSTRACT

This invention is directed to the provision of a data input device that is operated by a novel method of inputting the force applied on a force sensor as polar coordinate data and subjecting the data to input processing which utilizes the r value and the θ value.

A portable telephone 1 detects the force applied on a force sensor 51 of an input unit 50 as rectangular coordinate data and converts the detected rectangular coordinate data into polar coordinate data. Then, with reference to an allocating table that has recorded characters and ranges of θ values to which the individual characters are allocated, the character allocated to the obtained θ value is selected. Then, when the r value larger than a prescribed threshold is input, the entry of the selected parameter is determined.

16 Claims, 10 Drawing Sheets

Fig.3
(A) 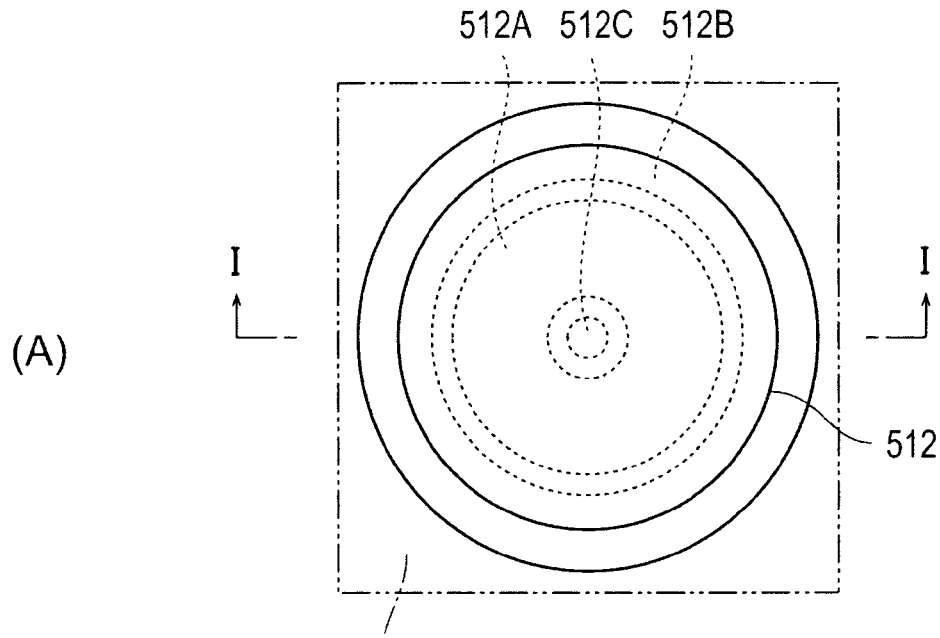
(B) 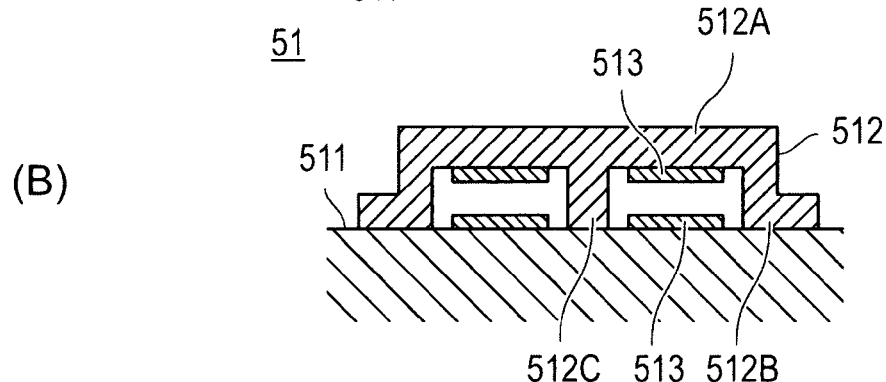
(C) 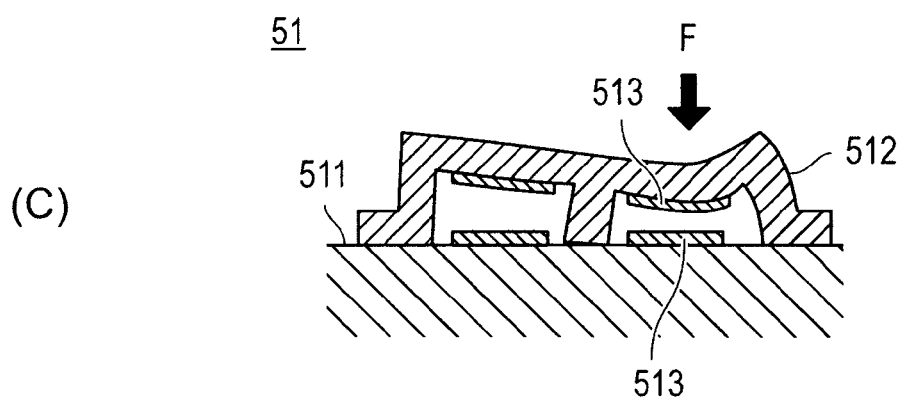

Fig.5

| $r$ | $r = \sqrt{x^2 + y^2}$ | |
|---|---|---|
| $\theta$ | IF: $x=0, y>0$ | $\theta = 90(°)$ |
| | IF: $x=0, y<0$ | $\theta = 270(°)$ |
| | IF: $x>0$ | $\theta = \tan^{-1}\left(\frac{y}{x}\right)(°)$ |
| | IF: $x<0$ | $\theta = \tan^{-1}\left(\frac{y}{x}\right) + 180(°)$ |

| Y/X VALUE | 0.01 | 0.087 | 0.176 | 0.268 | 0.363 | 0.467 | 0.578 | 0.7 | 0.84 |
|---|---|---|---|---|---|---|---|---|---|
| $\theta$ | 89.4 | 85.0 | 80.0 | 75.0 | 70.0 | 65.0 | 60.0 | 55.0 | 50.0 |

| Y/X VALUE | 1 | 1.19 | 1.43 | 1.73 | 2.14 | 2.75 | 3.75 | 5.65 | 11.4 |
|---|---|---|---|---|---|---|---|---|---|
| $\theta$ | 45.0 | 40.0 | 35.0 | 30.0 | 25.0 | 20.0 | 15.0 | 10.0 | 5.0 |

82

| θ | CHARACTER |
|---|---|
| 0~ 30° | 0 |
| 30~ 60° | 1 |
| 60~ 90° | 2 |
| 90~120° | 3 |
| 120~150° | 4 |
| 150~180° | 5 |
| 180~210° | 6 |
| 210~240° | 7 |
| 240~270° | 8 |
| 270~300° | 9 |
| 300~330° | # |
| 330~360° | * |

| θ | CHARACTER |
|---|---|
| 5~ 25° | 0 |
| 35~ 55° | 1 |
| 65~ 85° | 2 |
| 95~115° | 3 |
| 125~145° | 4 |
| 155~175° | 5 |
| 185~205° | 6 |
| 215~235° | 7 |
| 245~265° | 8 |
| 275~295° | 9 |
| 305~325° | # |
| 335~355° | * |

ORDER OF CHARACTER DISPLAY :
1~9 → # → * → $ → % → &

Fig.13
(A)　　　　　　(B)　　　　　　(C)
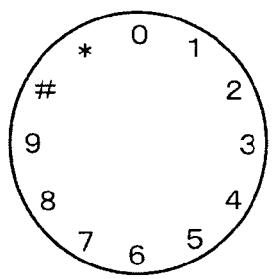 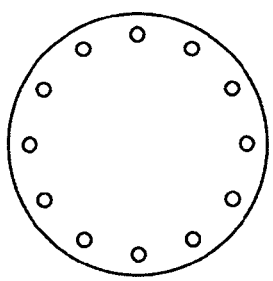 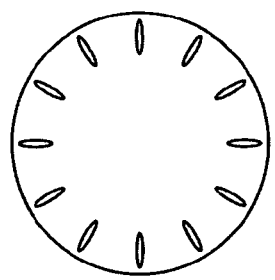
(D)　　　　　　(E)　　　　　　(F)
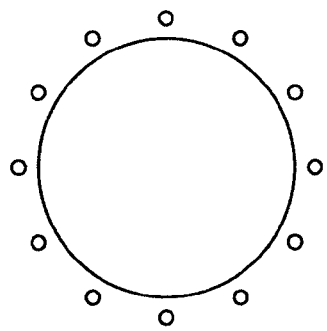 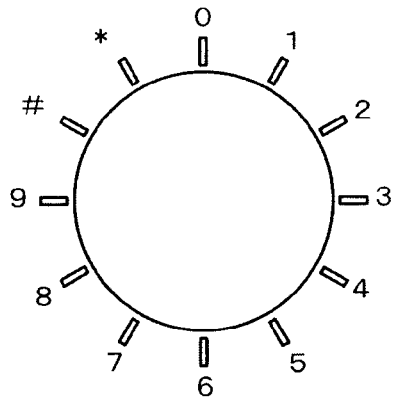 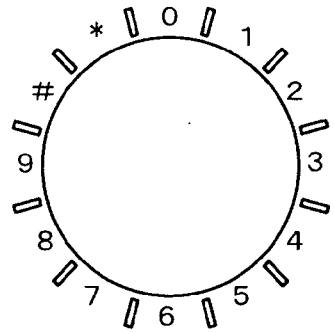
(G)　　　　　　(H)
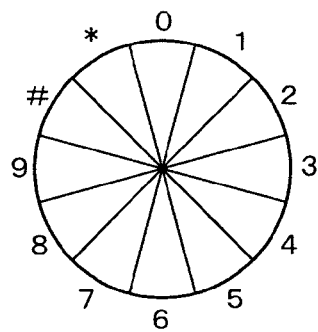 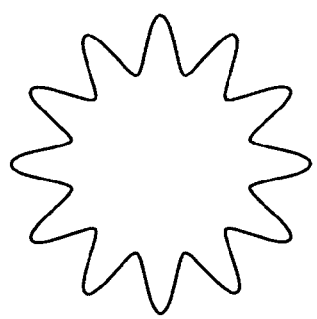

DATA INPUT DEVICE, DATA INPUT METHOD, DATA INPUT PROGRAM AND RECORDING MEDIUM WHEREIN SUCH DATA INPUT PROGRAM IS RECORDED

BACKGROUND OF THE INVENTION

1. Field of the Invention

This invention relates to a data input device (human input device). More particularly, this invention relates to a data input device for allowing the force applied on a force sensor to be entered therein as polar coordinate data.

2. Description of the Related Art

In the input devices such as the pointing devices in the note-type personal computers and the joy sticks in the television games, force sensors adapted to operate in four directions or numerous directions are used. These force sensors measure the force applied on their sensor parts by utilizing a change in the electrostatic capacity or a change in the resistance wire and output this force as converted into an electric signal. In this case, the output signals from these force sensors are generally obtained as rectangular coordinate data, namely the components in the XY directions.

In the case of a game device, for example, the force applied on the force sensor is input to the game device as rectangular coordinate data and the character on the game produces a motion equivalent in quantity to the input data on the XY plane (for example, moves in an amount designated by the input XY component from the existing position). On the menu selecting screen, for example, the items and the menus allocated to the region belonging to the rectangular coordinate data input from the force sensor are offered for selection.

The data input device that, as contemplated by this invention, inputs the force applied on the force sensor as polar coordinate data, namely r value (the magnitude of force) and θ value (the direction of force), however, has never been known.

This invention, therefore, is aimed at providing a data input device that is operated by a novel method of inputting the force applied on a force sensor as polar coordinate data and subjecting the data to input processing which utilizes the r value and the θ value.

SUMMARY OF THE INVENTION

The aforementioned object of this invention is accomplished by the following means.

(1) A data input device comprising: a detecting unit for detecting an applied force; a selecting unit for selecting a parameter to be input in accordance with the direction of the force detected by said detecting unit; and a determining unit for determining to input the parameter selected by said selecting unit in accordance with the magnitude of the force detected by said detecting unit.

(2) A data input device comprising: a detecting unit for detecting an applied force as rectangular coordinate data; a converting unit for converting the rectangular coordinate data detected by said detecting unit into polar coordinate data; a selecting unit for selecting a parameter to be input in accordance with the θ value of the polar coordinate data converted by said converting unit; and a determining unit for determining to input the parameter selected by said selecting unit in accordance with the r value of the polar coordinate data converted by said converting unit.

(3) A data input device described in (2), further comprising: a storage unit for storing an allocating table having registered therein parameters and ranges of θ values serving to allocate the individual parameters; wherein said selecting unit is adapted to select as the parameter to be input the parameter allocated to the θ value obtained by said converting unit by reference to the allocating table stored in said storage unit.

(4) A data input device described in (3), wherein the allocating table stored by said storage unit has ranges of θ values possessing no allocated parameter interspersed between the ranges of θ values having allocated the individual parameters.

(5) A data input device described in (2), further comprising: a first calculating unit for calculating the amount of change in the θ values obtained by said converting unit; wherein said selecting unit is adapted to select the parameters to be input in an order prescribed for each prescribed amount of change relative to the amount of change calculated by said first calculating unit.

(6) A data input device described in any of (2)-(5), further comprising: a display unit for displaying the parameter selected by said selecting unit.

(7) A data input device described in any of (2)-(6), further comprising: a first judging unit for judging whether the r value obtained by said converting unit is larger than a prescribed threshold; wherein said selecting unit is adapted to select the parameter to be input when said first judging unit judges that the r value is larger than the threshold.

(8) A data input device described in any of (2)-(7), further comprising: a second judging unit for judging whether the r value obtained by said converting unit is larger than a prescribed threshold; wherein said determining unit is adapted to determine to input the parameter selected by said selecting unit when said second judging unit judges that the r value is larger than the threshold.

(9) A data input device described in any of (2)-(7), further comprising: a second calculating unit for calculating the amount of change of the r value obtained by said converting unit; and a third judging unit for judging whether the amount of change of the r value calculated by said second calculating unit is larger than the prescribed threshold; wherein said determining unit determines to input the parameter selected by said selecting unit when said third judging unit judges that the amount of change of the r value is larger than the threshold.

(10) A data input device described in any of (2)-(7), further comprising: a third calculating unit for calculating the amount of change of the θ value obtained by said converting unit; a fourth calculating unit for calculating the amount of change of the r value obtained by said converting unit; and a fourth judging unit for comparing the amount of change of the θ value calculated by said third calculating unit and the amount of change of the r value calculated by said fourth calculating unit and judges which of the amounts of change is larger than the remainder; wherein said selecting unit selects the parameter to be input when said fourth judging unit judges that the amount of change of the θ value is larger and said determining unit determines to input the parameter selected by said selecting unit when said fourth judging unit judges that the amount of change of the r value is larger.

(11) A data input device described in any of (1)-(10), wherein said parameter consists of a number and a prescribed symbol.

(12) A data input device described in any of (1)-(11), wherein said parameter is displayed on a key top or the housing of the peripheral part of a key top.

(13) A data input device described in any of (1)-(12), wherein the key top or the housing of the peripheral part of the key top is provided thereon with punctiform or linear projections, grooves, or convexo-concave patterns with the object of aiding in the selection of the character.

(14) A data input device described in any of (1)-(13), wherein the key top possesses a petallike or starlike shape.

(15) A data input device described in any of (1)-(14), wherein said data input device is a portable telephone, a PHS, a note-type personal computer, a portable game device, a PDA, an electronic pocketbook, a remote controller for an electronic device, a camera, a digital camera, or a cam coder.

(16) A data input device described in any of (1)-(15), wherein said data input device is a peripheral instrument for a computer or a game device.

(17) A data input method comprising: a detecting step of detecting an applied force; a selecting step of selecting a parameter to be input in accordance with the direction of the force detected by said detecting step; and a determining step of determining to input the parameter selected by said selection step in accordance with the magnitude of the force detected by said detecting step.

(18) A data input method comprising: a detecting step of detecting an applied force as rectangular coordinate data; a converting step of converting the rectangular coordinate data detected by said detecting step into polar coordinate data; a selecting step of selecting the parameter to be input in accordance with the θ value of the polar coordinate data converted by said converting step; and a determining step of determining to input the parameter selected by said selection step in accordance with the r value of the polar coordinate data converted by said converting step.

(19) A data input program for causing a data input device to execute: a detecting step of detecting an applied force; a selecting step of selecting a parameter to be input in accordance with the direction of the force detected by said detecting step; and a determining step of determining to input the parameter selected by said selection step in accordance with the magnitude of the force detected by said detecting step.

(20) A data input program for causing a data input device to execute: a detecting step of detecting an applied force as rectangular coordinate data; a converting step of converting the rectangular coordinate data detected by said detecting step into polar coordinate data; a selecting step of selecting the parameter to be input in accordance with the θ value of the polar coordinate data converted by said converting step; and a determining step of determining to input the parameter selected by said selection step in accordance with the r value of the polar coordinate data converted by said converting step.

(21) A non-transitory computer readable recording medium on which the data input program as described in (19) and (20) is recorded.

This invention provides a data input device operated by a novel method of inputting the force applied on a force sensor as polar coordinate data and performing data input processing by utilizing the r value and the θ value and, therefore, realizes a data input device that is capable of maintaining a high function and enabling a simple and easy operation without necessitating numerous input keys and operation keys.

BRIEF DESCRIPTION OF THE DRAWINGS

FIG. 3 is a drawing illustrating one example of the configuration of a force sensor 51; (A) a plan view, (B) a cross section taken across (A) along the line I-I, and (C) the state in which force is applied on part of the force sensor 51 shown in (B).

FIG. 5 is a set of formulas to be used for converting the rectangular coordinate date into the polar coordinate data.

FIG. 6 is a conversion table for converting the X/Y value to θ.

FIG. 13 is a drawing illustrating other examples of the configuration of a key top part and the housing of a peripheral part in the data input device contemplated by this invention.

DETAILED DESCRIPTION OF THE PREFERRED EMBODIMENTS

Now, the preferred embodiments of this invention will be described in detail below by reference to the accompanying drawings.

Figure 1:
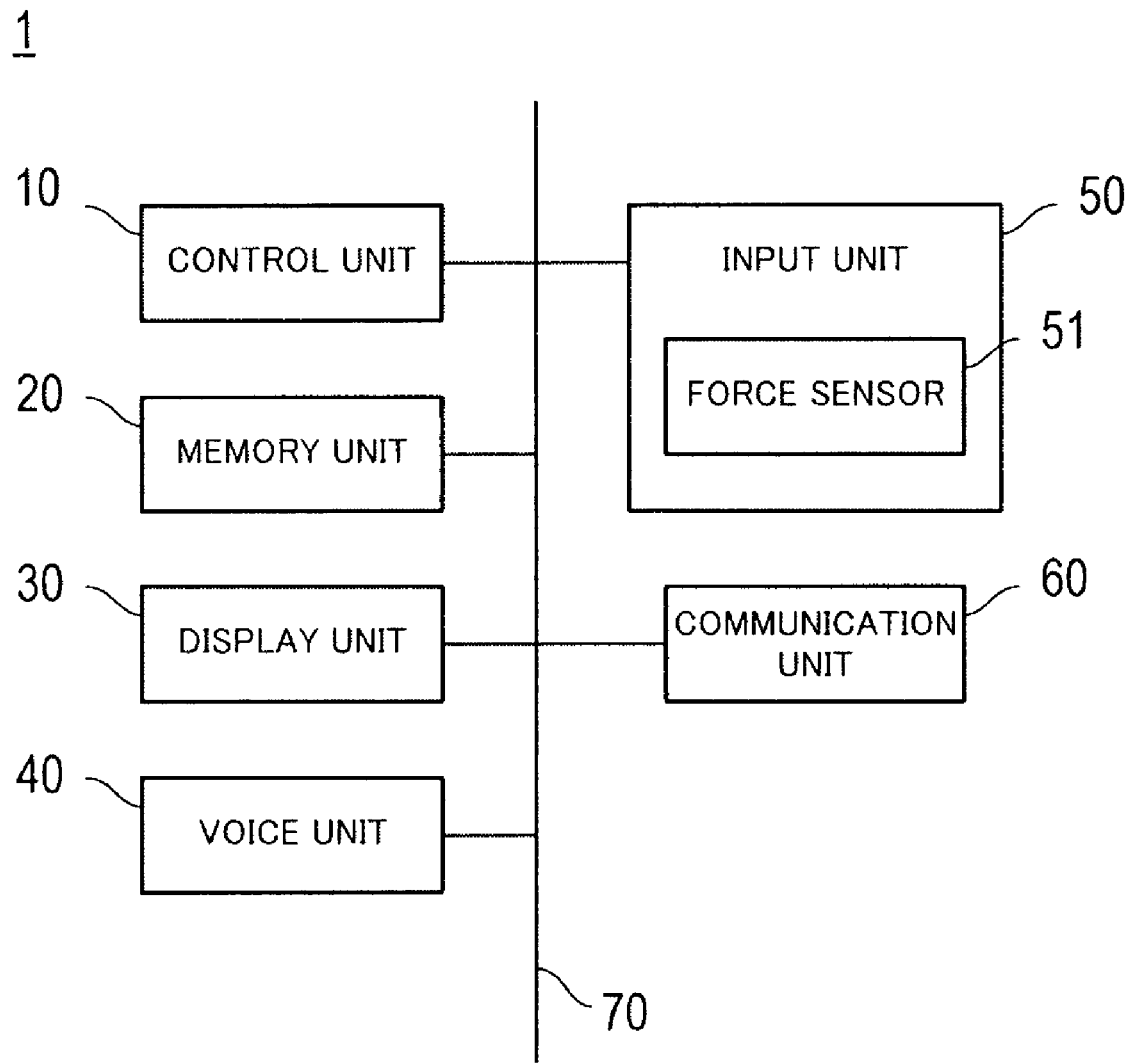
FIG. 1 is a block diagram illustrating the configuration of a portable telephone having applied a data input device contemplated by this invention.

FIG. 1 is a block diagram illustrating the constitution of a portable telephone to which a data input device of this invention is applied.

A portable telephone 1 to which the present preferred embodiment pertains, as illustrated in FIG. 1, is furnished with a control unit 10, a memory unit 20, a display unit 30, a voice unit 40, an input unit 50, and a communication unit 60. These parts are mutually connected via a bus 70 serving to exchange signals.

The control unit 10 is a CPU and carries out such actions as controlling the component units mentioned above and processing various operations in accordance with a program. The memory unit 20 comprises a ROM for keeping various programs and parameters in advance in storage and a RAM, i.e. a working area, for keeping programs and data in temporary storage. The display unit 30 is a liquid crystal display and is used for the purpose of displaying various kinds of information. The voice unit 40 is a speaker and a microphone and is used for inputting and outputting voices. The input unit 50 consists of a force sensor 51 that will be specifically described herein below and, when necessary, is further furnished with varying function keys 52 such as a selection key for selecting the function of the input unit 50 or a power supply key for switching on or off a power supply. It is used for entering various kinds of inputs. The communication unit 60 carries out mobile communication by using the electric wave of a prescribed frequency band and making connection to a mobile communication network in accordance with a prescribed communication method such as FDMA, TDMA, PDC, GSM, CDMA, or GPRS, for example.

Figure 2:
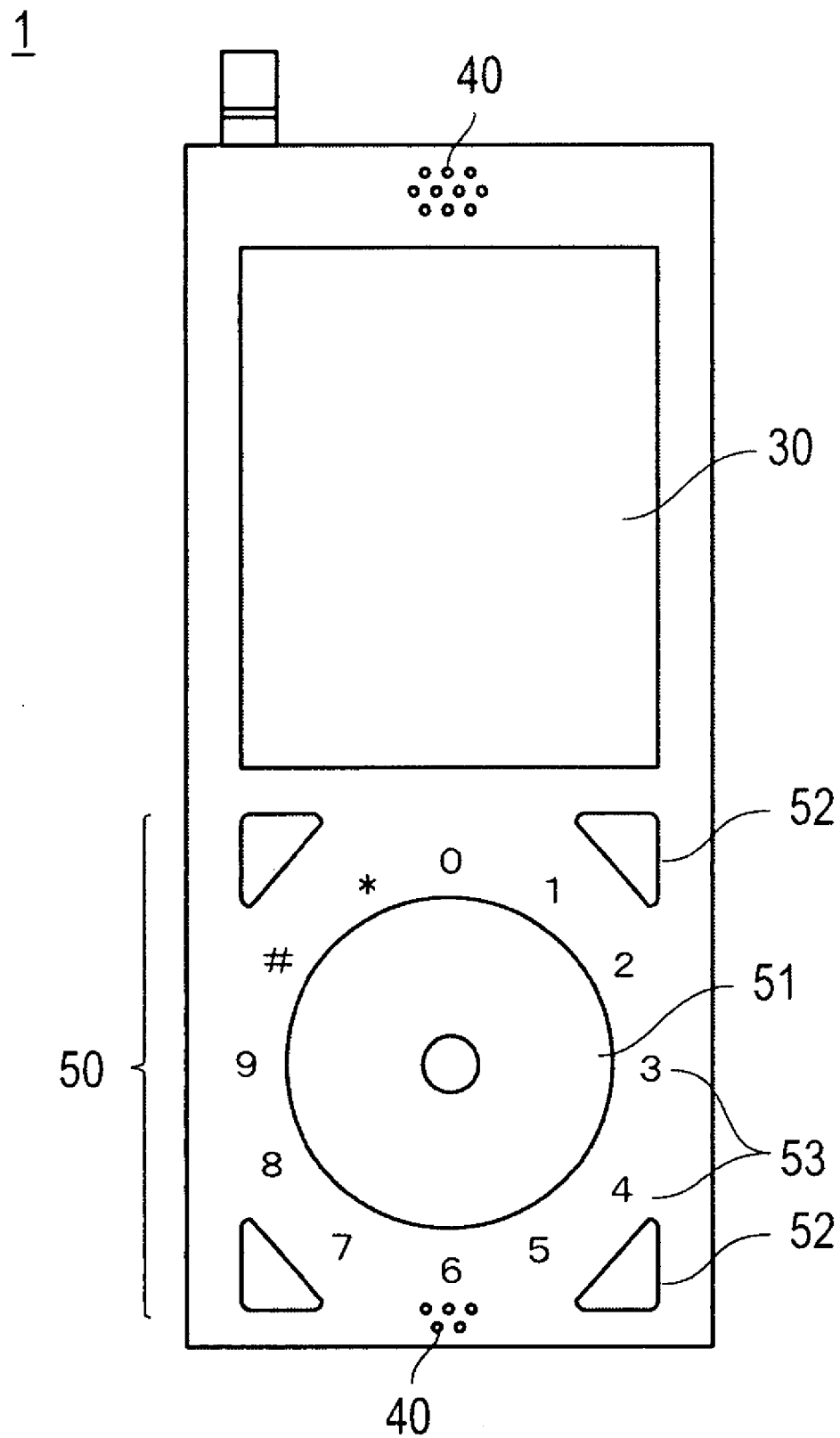
FIG. 2 is a schematic plan view for aiding in the explanation of an outer construction of a portable telephone 1.

FIG. 2 is a schematic plan view for aiding in the explanation of the outer configuration of the portable telephone 1. The input unit 50 of the portable telephone 1, as illustrated in FIG. 2, is furnished with the force sensor 51 in place of a ten-key pad partaking in the construction of the input unit of an ordinary portable telephone. Further, on the surface of the housing of the peripheral part of the key top part of the force sensor 51, a character 53 consisting of numbers and symbols is disposed and displayed. The functions of the force sensor 51 and the character 53 will be specifically described herein below.

Now, the force sensor 51 to be used in the input unit 50 of the portable telephone 1 to which the present preferred embodiment pertains will be explained by reference to FIG. 3. FIG. 3 is a drawing illustrating one example of the constitution of the force sensor 51. (A) depicts a plan view, (B) depicts a cross section taken across (A) along the line I-I, and (C) depicts the state in which force is applied on part of the force sensor 51 shown in (B).

The force sensor 51 is a force sensor based on the principle of electrostatic capacity and is composed of a base 511 and a displacement unit disposed on the base 511 as illustrated in FIGS. 3 (A) and (B). The displacement unit 512 is configured by integrating a discal key top part 512A, a barrel peripheral wall part 512B, and a cylindrical supporting part 512C disposed in the central part, made of an elastic material such as rubber or a metal, and designed to deform under an external force and restore the original form after elimination of the external force.

Inside the force sensor 51, annular electrodes 513 are disposed on the inner surface part of the key top part 512A of the displacement unit 512 and the base 511 as opposed to each other. When force F is applied on the key top part 512A of the force sensor 51 by the user's finger tip as illustrated in FIG. 3 (C), the displacement unit 512 is deformed proportionately to the force and the opposed electrodes 513 of the deformed part thereof approaches each other and thereby shortens their distance. The force sensor 51 extracts a consequently increased electrostatic capacity and outputs it as an electric signal. The output from the force sensor 51 is obtained as rectangular coordinate data, namely the components in the rectangular XY directions.

The system and the structure of the force sensor that can be utilized for the data input device of this invention does not need to be particularly restricted but is only required to be capable of converting an applied force into an electric signal and outputting the electric signal as rectangular coordinate data. The force sensor of varying system and structure utilizing the change of a magnetic wire, the change of variable resistance, the change of magnetic force, etc. besides utilizing the change of electrostatic capacity can be used.

Figure 4:
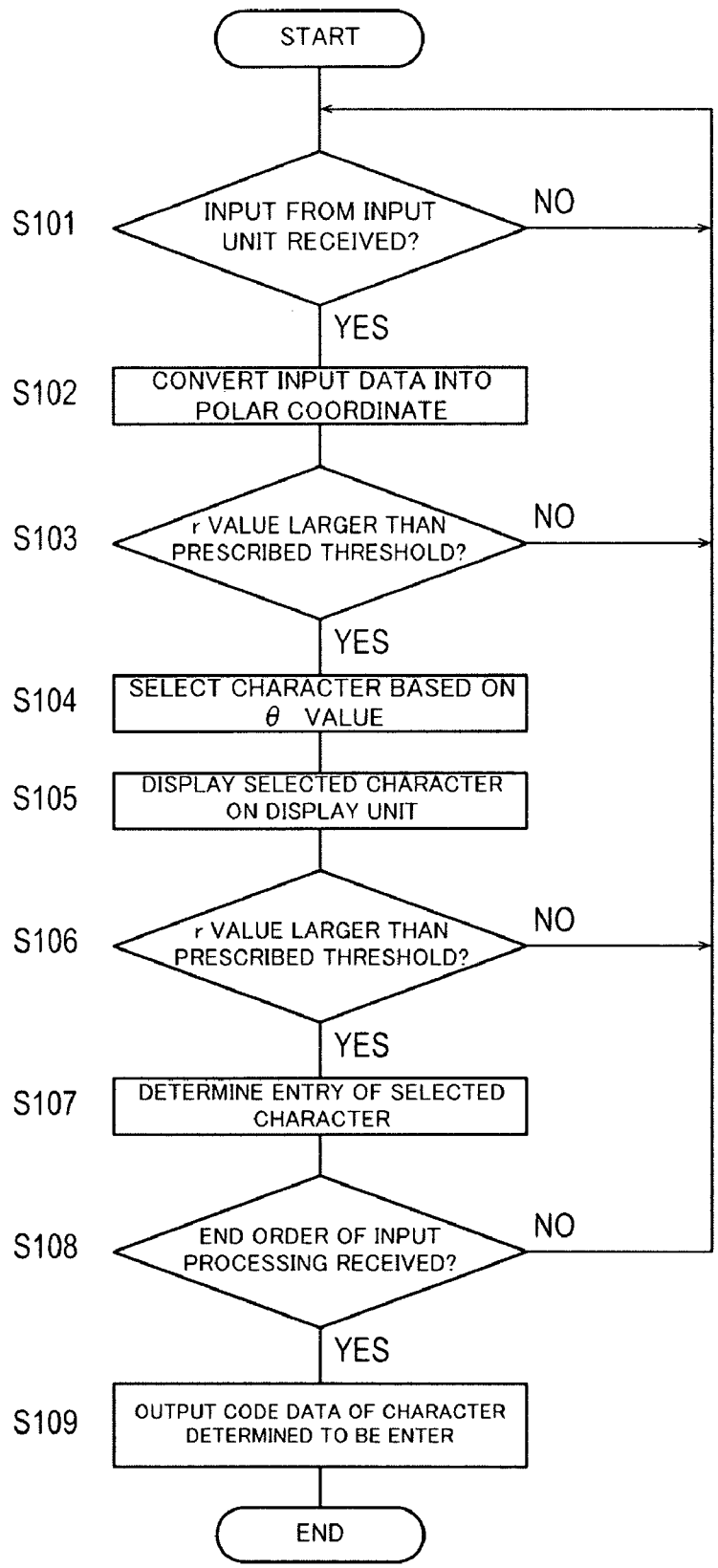
FIG. 4 is a flow chart illustrating a procedure followed by a control unit 10 of the portable telephone 1 in subjecting a character to input processing.

Next, the operation of the portable telephone 1 in the present preferred embodiment will be explained in outline. FIG. 4 is a flow chart illustrating a procedure followed by the control unit 10 of the portable telephone 1 of the present preferred embodiment in subjecting a character to input processing. Incidentally, the algorithm shown by the flow chart of FIG. 4 is stored as a control program in the memory unit 20 of the portable telephone and is read out and executed by the control unit 10 when the operation is started.

Referring to FIG. 4, the control unit 10 of the portable telephone 1 waits until it receives an input from the input unit 50 (NO at S101). When an external force is applied on the key top part 512A of the force sensor 51 of the input unit 50 as by the user's finger tip, the input unit 50 extracts the applied force as the rectangular coordinate data and outputs it to the control unit 10.

The control unit 10, on receiving an input from the input unit 50 (YES at S101), converts the entered rectangular coordinate data into the polar coordinate data through polar coordinate conversion in accordance with the conversion formula shown in FIG. 5 and consequently obtains the r value (magnitude of the force) and the θ value (direction of the force) (S102). This conversion to the θ value may be accomplished by having a conversion table 81 from X/Y value to θ as shown in FIG. 6 stored in advance in the memory unit 20 and utilizing this table instead of resorting to the conversion formula mentioned above. While FIG. 6 illustrates an example of the θ value conversion table using a pitch angle of 5°, it goes without saying that the pitch of the conversion table to be utilized may be properly adjusted as the occasion demands.

Next, the r value obtained at Step S102 is compared with the prescribed threshold. When the r value is less than the threshold (NO at S103), the process returns to the step S101 and waits a new input from the input unit. By setting this threshold at a proper level, therefore, it is made possible to exclude effectively the input such as incorrect operation of the input unit and sensor noise that is not expected by the user.

When the r value is found at the step S103 to be larger than the threshold (YES at S103), the process makes reference to the character allocating table stored in the memory unit 20 and selects the character based on the θ value obtained at the step S102 (S104).

Figures 7, 8:
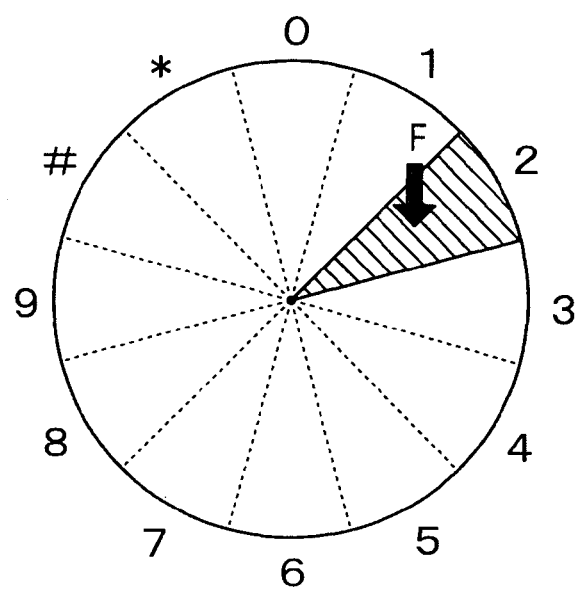
FIG. 7 is a drawing illustrating one example of the character allocating table.
FIG. 8 is a drawing illustrating a character allocating region of a key top part 512A according to a character allocating table 82.

FIG. 7 is a drawing illustrating one example of the character allocating table. In the present preferred embodiment, a total of 12 characters, i.e. the numerical values "0"-"9" and the symbols "#" and "*", to the ranges of 30° of the θ value as illustrated in FIG. 7. According to a character allocating table 82 of FIG. 7, therefore, the key top part 512A of the force sensor 51 is enabled to have allocated thereto one character for each of the 12 regions divided by a notch angle of 30° of the θ value. By adjusting the position of θ=0°, therefore, it is made possible to allocate to a given region the character disposed in the peripheral edge part adjoining the region. The key top part 512A illustrated in FIG. 8 can be so adapted that the character "2" may be selected when the region indicated by hatching thereon is depressed by the user.

Figures 9, 10:
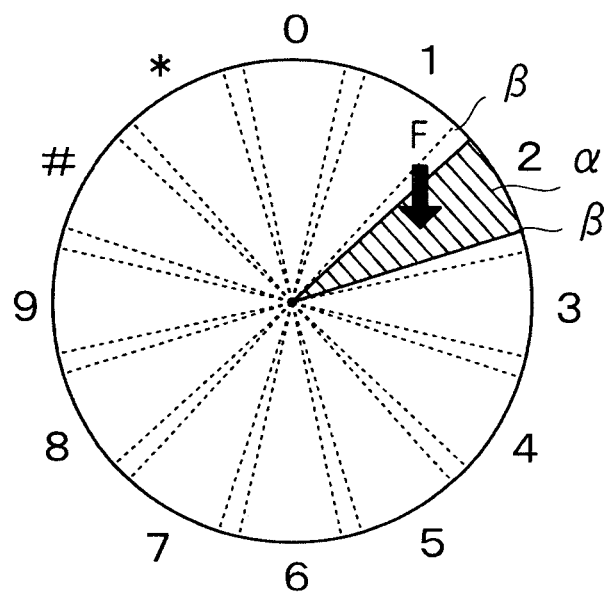
FIG. 9 is a drawing illustrating another example of the character allocating table.
FIG. 10 is a drawing illustrating a character allocating region of a key top part 512A according to a character allocating table 83.

FIG. 9 is a drawing illustrating another example of the character allocating table. In the character allocating table of FIG. 9, since one character is allocated to a range of 20° of the θ value and no character is allocated to the next range of 10° of the θ value, a sensible zone α having a character allocated and an insensible zone β having no character allocated as illustrated in FIG. 20 appear alternately on the key top part 512A of the force sensor 51. In the example of FIG. 8, when the vicinity of the border of a region is depressed, the character not expected by the user will possibly be selected because the input made by the finger tip generally induces vibration (hand vibration). By contrast, in the example of FIG. 10, the presence of insensible zones enables infallible selection of an expected character.

It need scarcely be said that in either of the examples described above, the number and the kind of characters to be allocated by the character allocating table and the range and the size of the θ value to which a character is allocated (or no character is allocated) can be suitably varied as the occasion demands. The size of the range of the θ value to which a character is allocated (or no character is allocated) may be fixed or varied by the kind, state, and position of a character. When the selected character is displayed in a pop-up pattern in the display unit, for example, or even when the display is made in the ordinary pattern, it is permissible to have a larger range allocated to the selected character than to the other character with a view to facilitating the determining operation. The size of the range of allocation of the θ value may be varied with the position (angle) of a given character to suit the user's operating characteristics such as the distinction between the right-handedness and the left-handedness.

Figure 11:
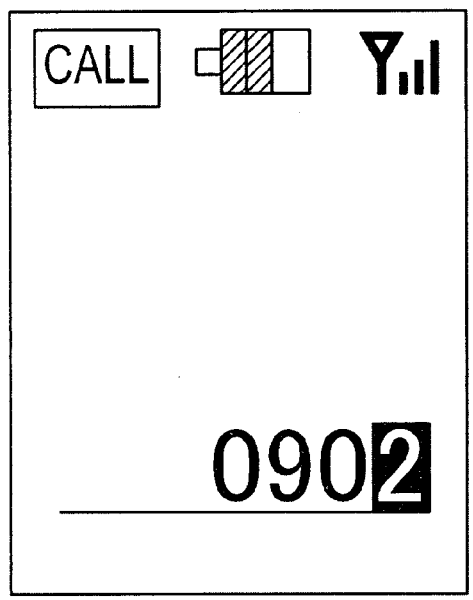
FIG. 11 is a drawing illustrating one example of a display unit 30 for displaying a selected character.

When a character is selected at the step S104, the selected character is displayed on the display unit 30 (S105). FIG. 11 is a drawing illustrating one example of the screen of the display unit 30 that is displaying the selected character. In a screen 91, "090" is a character already determined to be input and "2" is a selected character appearing in a reversing mode. For the purpose of enabling the character to appear clearly in a selected state as described above, the character may be displayed in a reversing mode, a blinking mode, a highlighting (thick letter) mode, or a cursory mode or in a state varied in size of letter, color of letter, background color, or the like from the other characters.

Next, when the r value obtained at the step S102 is compared with the prescribed threshold and is found to be smaller than the threshold (NO at S106), the process returns to the step S101 and waits a new input from the input unit. This threshold is set at a larger magnitude than the threshold of the step S103. Consequently, the selected character may be changed any number of times till the user depresses the key top part 512A of the force sensor 51 with strong force with the intension of determining entry of the character selected at the step S104.

On the other hand, the step S106, when the r value is larger than the threshold (YES at S106), determines entry of the character selected at the step S104 (S107) and repeats the next character input processing till an end order of the character input processing is issued (NO at S108 and S101-S107). When the end order of the character input processing is issued (YES at S108), the code data applied to the character determined to be entered is output to other application (S109) and the input processing of the character is terminated.

Figure 12:
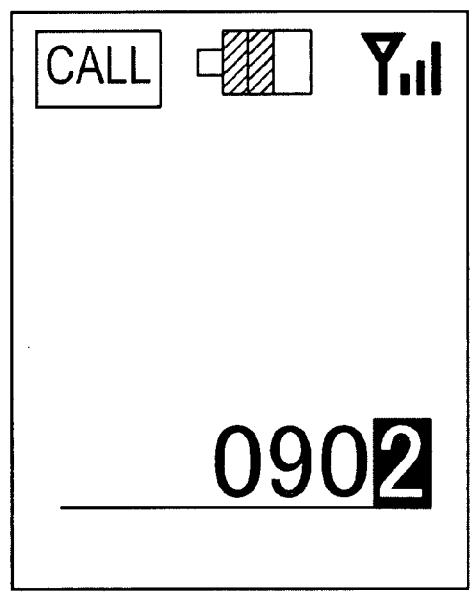
FIG. 12 is a drawing illustrating one example of the screen of the display unit 30 for displaying the character selected by another method.

The preferred embodiment described above has selected the character allocated to the range of the θ value based on the θ value that has been input. As another example of the way of selecting the character, a method that comprises starting to record the θ values at the point of time when the r value exceeds the threshold (YES at S103) thereby finding the amount of change (amount of difference) of the θ values and causing the candidates of characters for selection to be exhibited on the display in a prescribed order assigned for each of the amounts of change is available. FIG. 12 is a drawing illustrating one example of the screen of the display unit 30 for displaying the characters selected by this method. In a screen 92, whenever the value of θ is changed by an increment of +20°, the candidates for selection change their places in the order of "0"-"9", "#", "*", "$", and "&" (or in the reversed order whenever the change is made by the increment of −20°) in accordance with the prescribed order of character display.

The preferred embodiment described above is directed toward judging the user's intension of determining the characters by the magnitude of the r value, namely the question whether or not the force exceeding a prescribed magnitude has been applied. This invention does not need to limit the method for determining the character to this preferred embodiment. Besides the method described above, a method that effects the determination by the magnitude of the amount of change of the r value (the differential amount or difference amount of the r value), namely by the question whether or not the force applied suddenly increases, a method that is combined with a determination key installed separately, and the like may be cited. Otherwise, a method that implements the judgment by combining the amount of change of the r value and the amount of change of the θ value may be adopted. Specifically, when the amount of change of the θ value is larger than the amount of change of the r value, for example, the expected character is judged as selected and that character is processed as selected and not as determined in spite of exertion of some extent of force. On the contrary, when the amount of change of the r value is larger than the amount of change of the θ value, the motion for determination is regarded as started and the relevant character is processed as determined in spite of some extent of fluctuation (vibration) of the θ value.

The preferred embodiment described above has contemplated the disposition of characters on the housing in the peripheral part of the key top part of the force sensor. This invention does not need to limit the construction of the key top part and the peripheral housing thereof in the data input device to this preferred embodiment but allows various alterations. FIG. 13 is a drawing illustrating examples of the other structure of the key top part and the peripheral housing thereof in the data input device of this invention. (A) depicts an example having the characters disposed on the key top part instead of the housing. In place of the character display or in conjunction with the character display, convexo-concaves, projections, grooves, or the like may be disposed on the key top part or the housing or both with the object of enabling the direction of selection to be found by the tactile sense of the finger tip. (B) depicts an example of having punctiform projections and (C) an example of having linear projections respectively disposed on the key top part. (D) depicts an example of having punctiform projections disposed on the housing and (E) and (F) severally depict an example of having linear projections disposed in tandem with the character display. These displays, projections, grooves, and the like may be adapted to emit light by means of LED and turned on with a choice. (G) depicts an example of having the key top part divided into 12 equal parts with as many ridges and consequently having depressed parts (the regions of character allocation) formed between the adjacent ridges, with the result that the characters will be infallibly selected. (H) depicts an example of having the key top formed in a petallike shape or a starlike shape with the object of enabling the directions of characters to be easily found by the shape of the perimeter of the key top.

Figure 14:
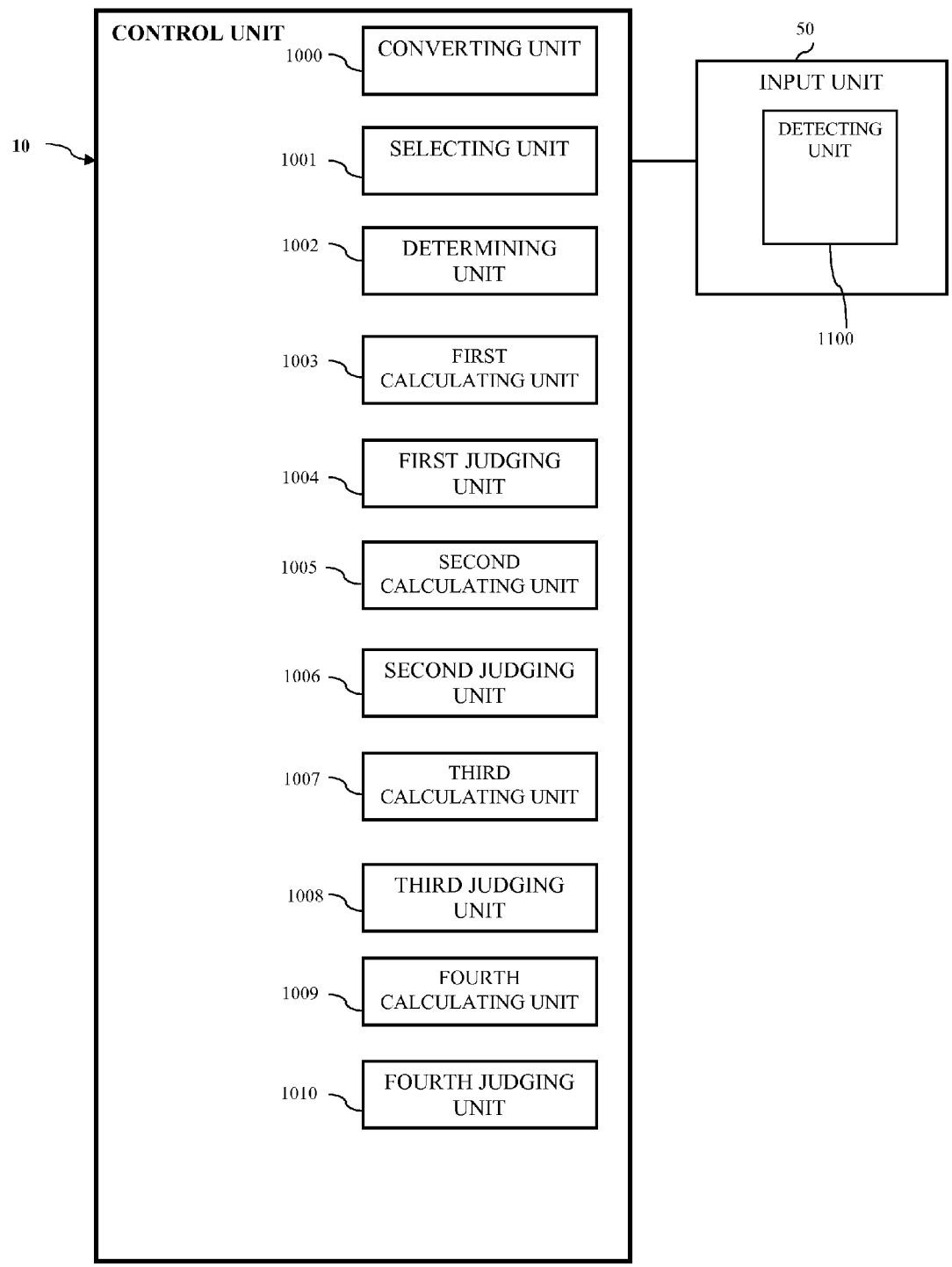
FIG. 14 is a drawing illustrating a data input device in accordance with an embodiment contemplated by this invention.

FIG. 14 is a drawing illustrating the data input device in accordance with an embodiment of the present invention. Detecting unit 1100 for detecting an applied force as rectangular coordinate data. Converting unit 1000 for converting the rectangular coordinate data detected by detecting unit 1100 into polar coordinate data. Selecting unit 1001 for selecting a character to be input in accordance with a θ value of the polar coordinate data converted by converting unit 1000. Determining unit 1002 for determining to input the character selected by selecting unit 1001 in accordance with an r value of the polar coordinate data converted by converting unit 1000. First calculating unit 1003 for calculating the amount of change of the θ value obtained by converting unit 1000. Second calculating unit 1005 for calculating the amount of change of the r value obtained by converting unit 1000. First judging unit 1004 for comparing the amount of change of the θ value calculated by first calculating unit 1003 and the amount of change of the r value calculated by second calculating unit 1005 and judges which of the amounts of change is larger under prescribed conditions. Second judging unit 1006 for judging whether the r value obtained by converting unit 1000 is larger than a prescribed threshold. Third calculating unit 1007 for calculating the amount of change in the θ values obtained by converting unit 1000. Third judging unit 1008 for judging whether the r value obtained by converting unit 1000 is larger than a prescribed threshold. Fourth calculating unit 1009 for calculating the amount of change of the r value obtained by converting unit 1000. Fourth judging unit 1010 for judging whether the amount of change of the r value calculated by fourth calculating unit 1009 is larger than the prescribed threshold.

The preferred embodiment described above has contemplated subjecting the portable telephone to the character input processing instead of the operation of a ten key pad. This invention does not need to limit the method for using the data input device to this preferred embodiment. Besides the purpose of use described above, the data input device of this invention can be used for the purpose of data input processing in place of the function key intended to dilate or switch various functions or the selection key intended to select items and menus.

The preferred embodiment described above has explained the data input device of this invention by reference to a portable telephone. This invention does not need to be limited to the use in the portable telephone. It can be applied to any device that is furnished with a data input unit (human input device).

As another example of the data input device of this invention, an electronic control-type camera which is furnished with an automatic focusing mechanism, an automatic exposure mechanism, and the like. Specifically, when the data input device of this invention is applied to a shutter button in an electronic control-type camera and a shutter, an exposure adjuster (exposure + and exposure −), a focal length adjuster (zoom in and zoom out), and the like are laid out in the camera, for example, the sole input unit can be utilized for performing the plurality of relevant operations and the shutter button, when depressed lightly, can be enabled to select the shutter function, operate the automatic focusing function, and make this function assume a standby state and, when depressed strongly, can be enabled to assume the mode of utility of releasing the shutter.

As other examples of the application of the data input device of this invention, portable computers such as the PHS, the note-type personal computer, the portable game device, the PDA, and the electronic pocket book and household electrical appliances such as the remote controllers for various electronic devices, digital cameras, and cam coders may be cited. Further, the data input device of this invention may be adapted to serve as peripheral instruments for personal computers and game devices, particularly as input instruments in substitution for mice, keyboards, and joy sticks.

The data input device and the data input method contemplated by this invention can be realized by utilizing the hardware circuit intended exclusively for executing the procedure mentioned above or by causing the CPU to carry out the program describing this procedure. When this invention is realized by the latter measure, the aforementioned program for executing the data input device may be provided by such a computer readable recording medium as a floppy (registered trademark) disk or a CD-ROM or may be supplied on line via a network such as an internet. In this case, the program that is recorded in the recording medium capable of computer reading is generally transferred to the ROM or the hardware and stored therein. Alternatively, this program may be provided as an independent application software or may be provided as a driver for exclusive use and consequently incorporated in the basic software of a data input device as one function thereof.

What is claimed is:

1. A data input device comprising:
    a detecting unit for detecting an applied force as rectangular coordinate data;
    a converting unit for converting the rectangular coordinate data detected by said detecting unit into polar coordinate data;
    a selecting unit for selecting a character to be input in accordance with a θ value of the polar coordinate data converted by said converting unit;
    a determining unit for determining to input the character selected by said selecting unit in accordance with an r value of the polar coordinate data converted by said converting unit;
    a first calculating unit for calculating the amount of change of the θ value obtained by said converting unit;
    a second calculating unit for calculating the amount of change of the r value obtained by said converting unit; and
    a first judging unit for comparing the amount of change of the θ value calculated by said first calculating unit and the amount of change of the r value calculated by said second calculating unit and judges which of the amounts of change is larger under prescribed conditions; wherein
    said selecting unit selects the character to be input when said judging unit judges that the amount of change of the θ value is larger and
    said determining unit determines to input the character selected by said selecting unit when said judging unit judges that the amount of change of the r value is larger.

2. The data input device described in claim 1, further comprising:
    a storage unit for storing an allocating table having registered therein characters and ranges of θ values serving to allocate the individual characters; wherein
    said selecting unit is adapted to select as the character to be input the character allocated to the θ value obtained by said converting unit by reference to the allocating table stored in said storage unit.

3. A data input device comprising:
    a detecting unit for detecting an applied force as rectangular coordinate data
    a converting unit for converting the rectangular coordinate data detected by said detecting unit into polar coordinate data;
    a selecting unit for selecting a character to be input in accordance with a θ value of the polar coordinate data converted by said converting unit;
    a determining unit for determining to input the character selected by said selecting unit in accordance with an r value of the polar coordinate data converted by said converting unit,
    a storage unit for storing an allocating table having registered therein characters and ranges of θ values serving to allocate the individual characters;
    said selecting unit is adapted to select as the character to be input the character allocated to the θ value obtained by said converting unit by reference to the allocating table stored in said storage unit, wherein
    the allocating table stored by said storage unit has ranges of θ values possessing no allocated character interspersed between the ranges of θ values having allocated the individual characters.

4. The data input device described in claim 1, further comprising:
a third calculating unit for calculating the amount of change in the θ values obtained by said converting unit; wherein
said selecting unit is adapted to select the characters to be input in an order prescribed for each prescribed amount of change relative to the amount of change calculated by said third calculating unit.

5. The data input device described in claim 1, further comprising:
a display unit for displaying the character selected by said selecting unit.

6. The data input device described in claim 1, further comprising:
a second judging unit for judging whether the r value obtained by said converting unit is larger than a prescribed threshold; wherein
said selecting unit is adapted to select the character to be input when said second judging unit judges that the r value is larger than the threshold.

7. The data input device described in claim 1, further comprising:
a third judging unit for judging whether the r value obtained by said converting unit is larger than a prescribed threshold; wherein
said determining unit is adapted to determine to input the character selected by said selecting unit when said third judging unit judges that the r value is larger than the threshold.

8. The data input device described in claim 1, further comprising:
a fourth calculating unit for calculating the amount of change of the r value obtained by said converting unit; and
a fourth judging unit for judging whether the amount of change of the r value calculated by said fourth calculating unit is larger than the prescribed threshold; wherein
said determining unit determines to input the character selected by said selecting unit when said fourth judging unit judges that the amount of change of the r value is larger than the threshold.

9. The data input device described in claim 1, wherein said character consists of a number and a prescribed symbol.

10. The data input device described in claim 1, wherein said character is displayed on a key top or the housing of the peripheral part of a key top.

11. The data input device described in claim 1, wherein the key top or the housing of the peripheral part of the key top is provided thereon with punctiform or linear projections, grooves, or convexo-concave patterns with the object of aiding in the selection of the character.

12. The data input device described in claim 1, wherein the key top possesses a petallike or starlike shape.

13. The data input device described in claim 1, wherein said data input device is a portable telephone, a PHS, a note-type personal computer, a portable game device, a PDA, an electronic pocketbook, a remote controller for an electronic device, a camera, a digital camera, or a cam coder.

14. The data input device described in claim 1, wherein said data input device is a peripheral instrument for a computer or a game device.

15. A data input method comprising:
a detecting step of detecting an applied force as rectangular coordinate data;
a converting step of converting the rectangular coordinate data detected by said detecting step into polar coordinate data;
a selecting step of selecting the character to be input in accordance with a θ value of the polar coordinate data converted by said converting step; and
a determining step of determining to input the character selected by said selection step in accordance with an r value of the polar coordinate data converted by said converting step;
a first calculating step for calculating the amount of change of the θ value obtained by said converting unit;
a second calculating step for calculating the amount of change of the r value obtained by said converting unit; and
a judging step for comparing the amount of change of the θ value calculated by said first calculating step and the amount of change of the r value calculated by said second calculating step and judges which of the amounts of change is larger under prescribed conditions; wherein;
said selecting step selects the character to be input when said judging step judges that the amount of change of the θ value is larger and
said determining step determines to input the character selected by said selecting step when said judging step fudges that the amount of change of the r value is larger.

16. A non-transitory computer readable recording medium on which a data input program is recorded, wherein said data input program for causing a data input device to execute:
a detecting step of detecting an applied force as rectangular coordinate data;
a converting step of converting the rectangular coordinate data detected by said detecting step into polar coordinate data;
a selecting step of selecting the character to be input in accordance with a θ value of the polar coordinate data converted by said converting step; and
a determining step of determining to input the character selected by said selection step in accordance with an r value of the polar coordinate data converted by said converting step;
a first calculating step for calculating the amount of change of the θ value obtained by said converting unit;
a second calculating step for calculating the amount of change of the r value obtained by said converting step; and
a judging step for comparing the amount of change of the θ value calculated by said first calculating step and the amount of change of the r value calculated by said second calculating step and judges which of the amounts of change is larger under prescribed conditions; wherein
said selecting step selects the character to be input when said judging step judges that the amount of change of the θ value is larger and
said determining step determines to input the character selected by said selecting step when said judging step fudges that the amount of change of the r value is larger.

* * * * *